United States Patent
Hosier et al.

(10) Patent No.: US 6,752,888 B2
(45) Date of Patent: Jun. 22, 2004

(54) MOUNTING AND CURING CHIPS ON A SUBSTRATE SO AS TO MINIMIZE GAP

(75) Inventors: Paul A. Hosier, Rochester, NY (US); Kraig A. Quinn, Webster, NY (US)

(73) Assignee: Xerox Corporation, Stamford, CT (US)

( * ) Notice: Subject to any disclaimer, the term of this patent is extended or adjusted under 35 U.S.C. 154(b) by 199 days.

(21) Appl. No.: 10/012,425

(22) Filed: Dec. 12, 2001

(65) Prior Publication Data

US 2003/0106208 A1 Jun. 12, 2003

(51) Int. Cl.[7] .......................... H01L 21/58; H01L 21/70
(52) U.S. Cl. .................... 156/160; 156/196; 156/299; 29/829; 29/832; 438/118
(58) Field of Search ................ 156/160, 196, 156/297, 299; 29/829, 832, 739, 740; 438/118, 457, 66

(56) References Cited

U.S. PATENT DOCUMENTS

| | | | |
|---|---|---|---|
| 5,219,796 A | 6/1993 | Quinn et al. | 437/227 |
| 5,510,273 A | 4/1996 | Quinn | 437/3 |
| 6,165,813 A | * 12/2000 | Quinn et al. | 438/67 |
| 6,514,835 B1 | * 2/2003 | Hendrix et al. | 438/457 |

* cited by examiner

Primary Examiner—Jeff H. Aftergut
Assistant Examiner—John T. Haran
(74) Attorney, Agent, or Firm—Christopher D. Wait

(57) ABSTRACT

The present disclosure relates that constraining a substrate into a convex arc prior to mounting and affixing of any chips, allows those chips to achieve exemplary final chip-to-chip abutment when the substrate is released and allowed to return to stasis. This is particularly of use where there are any intervening thermal cycles, and the thermal temperature coefficients of expansion for the chip/die and any substrate/mount are significantly different. This will allow the utilization of otherwise more desirable materials for the substrate in spite of some mismatch in thermal coefficients that may exist between the substrate and chips.

24 Claims, 5 Drawing Sheets

MOUNTING AND CURING CHIPS ON A SUBSTRATE SO AS TO MINIMIZE GAP

BACKGROUND OF THE INVENTION AND MATERIAL DISCLOSURE STATEMENT

The present invention relates generally to the mounting of semiconductor devices on a substrate or circuit board. The invention relates in particular with regards to the fabrication of raster input scanner arrays. The invention relates most particularly to the mounting of silicon image sensor chips/dies so as to achieve a collinear Full Width image sensor Array (FWA).

Image sensor dies for scanning document images, such as Charge Coupled Devices (CCDs), typically have a row or linear array of photo-sites together with suitable supporting circuitry integrated onto silicon. Usually, a die of this type is used to scan line by line across the width of a document with the document being moved or stepped lengthwise in synchronism therewith. In the alternative, the image sensor can be moved lengthwise with the document in a stationary position.

In the above application, the image resolution is proportional to the ratio of the scan width and the number of array photo-sites. Because of the difficulty in economically designing and fabricating long dies, image resolution for the typical die commercially available today is relatively low when the die is used to scan a full line. While resolution may be improved electronically as by interpolating extra image signals, or by interlacing several smaller dies with one another in a non-collinear fashion so as to crossover from one die to the next as scanning along the line progresses, electronic manipulations of this type adds to both the complexity and the cost of the system. Further, single or multiple die combinations such as described above usually require more complex and expensive optical systems.

However, a long or full width array, having a length equal to or larger than the document line and with a large packing of colinear photo-sites to assure high resolution, has been and remains a very desirable arrangement. In the pursuit of a long or full width array, forming the array by assembling several small dies together end to end has become an exemplary arrangement. However, this necessitates providing dies whose photo-sites extend to the border or edge of the die, so as to assure photo-site continuity when the die is assembled abutted end to end with other dies. By the same token when that is achieved it follows that the chip dies must be mounted in such a manner so as to assure close proximity of the photo-sites of one chip with the photo-sites of an abutting chip die. FWA's assembled with dies that are mounted with excessive gap between them suffer from image quality degradation due to lost image information at the gap locations.

One essential parameter in the fabrication of a FWA for which allowances must be made in any attempt at maintaining gap tolerances, is the thermal coefficient of the chip/dies relative to any substrate that the chip/dies are ultimately mounted upon. The prior approach has been to use a mounting substrate with a thermal coefficient that matches the thermal coefficient of the silicon chips. In particular, one printed circuit board (PCB) substrate of a specialty type typically used Ceracom, has a thermal coefficient of expansion (TCE) of six parts per million per degree centigrade (TCE=6 PPM/° C.). This compares favorably with a silicon TCE=3 PPM/° C. for the chip/dies.

However, Ceracom is expensive, and it would be very desirable to use a more cost effective solution as a substrate. In particular, it would be desirable, for example, to use an industry standard material such as FR-4. Unfortunately, FR-4 has a TCE of 13 PPM/° C.

Therefore, as discussed above, there exists a need for an arrangement and methodology which will solve the problem of preventing large gaps between chips mounted upon a substrate while allowing a cost effective material for the substrate. Thus, it would be desirable to solve this and other deficiencies and disadvantages as discussed above with an improved methodology for mounting, bonding, and curing chips upon a substrate while minimizing chip-to-chip gap.

The present invention relates to a method for assembling chips upon a substrate comprising arcing a curve in the substrate by applying restraining forces and placing the chips upon the curved substrate with an initial gap between the chips. This is followed by allowing a thermal cycle and releasing the restraining forces to allow the substrate to return to stasis.

The present invention also relates to a method for assembling chips upon a substrate comprising arcing a convex curve in the substrate by applying restraining forces, placing the chips upon the curved substrate with an initial gap between the chips, and releasing the restraining forces to allow the substrate to return to stasis.

The present invention further relates to a method for assembling chips upon a substrate comprising placing one face of the substrate against a convex restraining plate and applying restraining forces to the opposite face of the substrate to establish an arc in the substrate. This is followed by placing the chips upon the curved substrate with an initial gap between the chips, allowing a thermal cycle, and releasing the restraining forces to allow the substrate to return to stasis.

The present invention also relates to a method for assembling chips upon a substrate to make a full width array comprising choosing a radius of curvature and applying that radius of curvature to a first face of a convex restraining plate, then placing one face of the substrate against the first face of the convex restraining plate and applying restraining forces to the opposite face of the substrate to establish an arc in the substrate. This is followed by placing the chips with adhesive upon the curved substrate with an initial gap between the chips, allowing a thermal cycle of the curing adhesive, and releasing the restraining forces to allow the substrate to return to stasis.

The present invention further relates to a method for assembling chips upon a substrate comprising arcing a first curve in the substrate by applying restraining forces and placing the chips upon the curved substrate with an initial gap between the chips. Then arcing a second curve in the substrate by applying restraining forces, allowing a thermal cycle, and releasing the restraining forces to allow the substrate to return to stasis.

DESCRIPTION OF THE INVENTION

In the early stages of FWA sensor technology development, it was recognized that a butted collinear array of sensor chips would best be attached to a substrate that had a thermal temperature coefficient of expansion (TCE) close to that of silicon. This would prevent large gaps that cause image quality problems at high temperatures and also prevent compressive forces that could cause chip damage in the low temperature range. A search for an appropriate printed circuit board (PCB) material to use as a substrate, resulted in the choice of Ceracom, which matches quite well with silicon in TCE.

However, as Ceracom is about five to ten times more expensive than the industry standard PCB material FR-4, some work was done to check out the feasibility of using FR-4. One hundred reliability temperature stress cycles between −58° C. and +66° C. did not cause any physical or electrical-optical damage to FR-4 FWA sensor bars, even on bars with nearly butted chips. In addition, the gap increase under normal high temperature operating conditions did not result in significant image quality problems for lower resolution FWAs. However for higher resolution FWAs a switch over to the cheaper FR-4 material requires overcoming the increased chip-to-chip gap. There is an inherently larger gap at high temperatures on FR-4 sensors versus the Ceracom sensors. There are two sources for this delta between the two materials, the larger gap growth due to the higher TCE of FR-4, and there is also a larger starting gap after the bars are cured, also due to the larger TCE. A gap of 3–5 um is present even if the initial placement of chips is butted with no gap.

Figure 1:
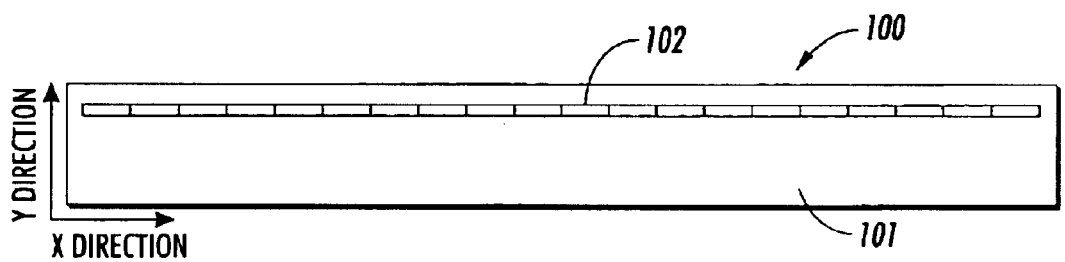
FIG. 1 depicts a schematical representation of a full width image sensor array with sensor chips mounted upon it.
Figure 2:
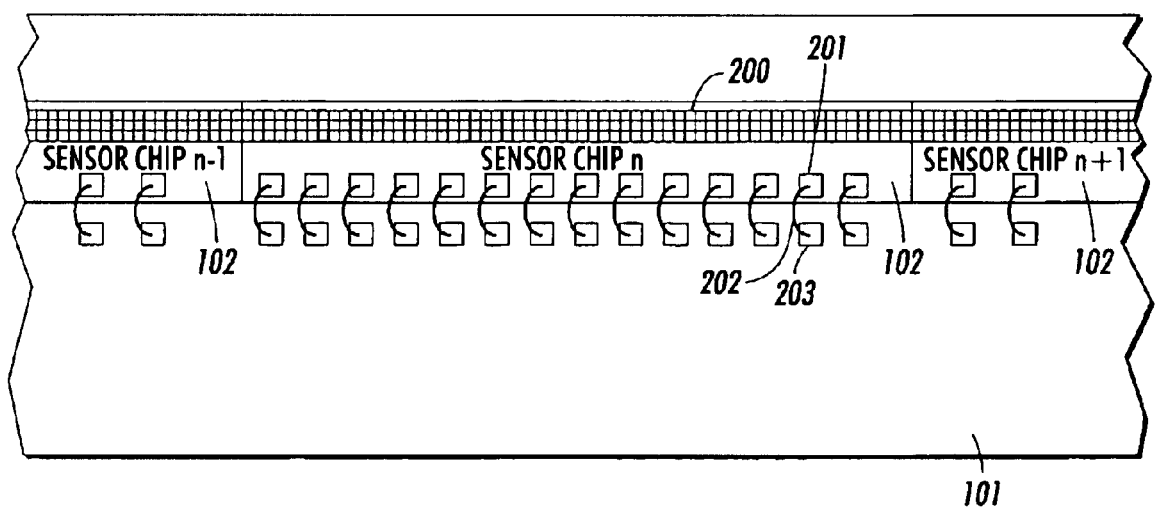
FIG. 2 depicts a close-up of the full width image sensor array depicted in FIG. 1.

FIG. 1 shows a top down (x-y) view of the FWA sensor bar. The sensor bar 100 is comprised of the FR-4 substrate 101 and chips 102. In this embodiment, the photo chips 102 are arranged as an end-to-end 1×20 linear array of twenty chips. FIG. 2 is a magnification and close up from FIG. 1 of a chip 102 with photodiodes 200 and provided with bonding pads 201. A flying wire connection 202 is provided between bonding pads 201 and the matching bonding pads 203 provided upon substrate 101. Electrical connection is thereby provided between substrate 101 and chips 102.

Figure 3:
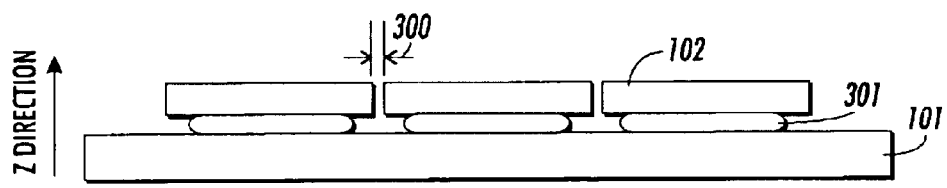
FIG. 3 depicts a schematical side view of a full width image sensor array.
Figure 4:
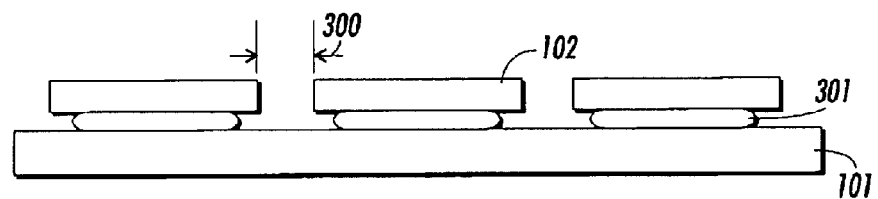
FIG. 4 depicts a schematical side view of a full width image sensor array during adhesive cure.
Figure 5:
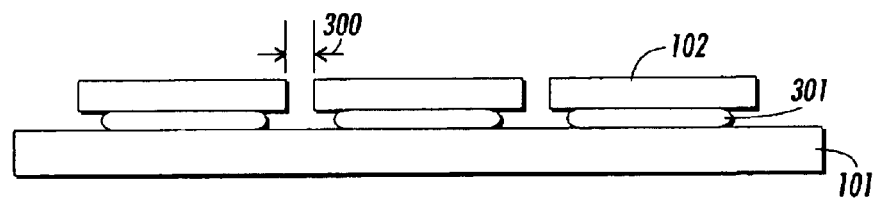
FIG. 5 depicts a schematical side view of a full width image sensor array after adhesive cure.

FIGS. 3 through 5 show a cross-section (x-z) view of a portion of a FWA sensor bar 100. As can be seen in FIG. 3, the chips 102 are initially placed close to each other, or butted, and gap 300 is small. At this point the chip adhesive 301 is not cured. During the curing of chip adhesive 301 the FR-4 substrate 101 expands more than the chips 102 and a large gap 300 appears between chips, as is shown in FIG. 4. While the adhesive 301 remains uncured, the chip 102 stays effectively pinned to the substrate 101 at its center. Sometime during the temperature ramp up and ramp down of the curing process, the chip adhesive 301 becomes cured and rigidly attached to the chip 102 at all points. Since the chip 102 and adhesive 301 are more rigid than the substrate 101 at this point, the substrate 101 does not contract as much as it would like to as the bar 100 is brought back to room temperature. The substrate 101 stays stretched and the pinning of the chip 102 near its ends results in a certain amount of the gap 300 getting locked in between chips, as shown in shown in FIG. 5. The invention addresses minimizing this final room temperature gap 300 as shown in FIG. 5.

Figure 6:
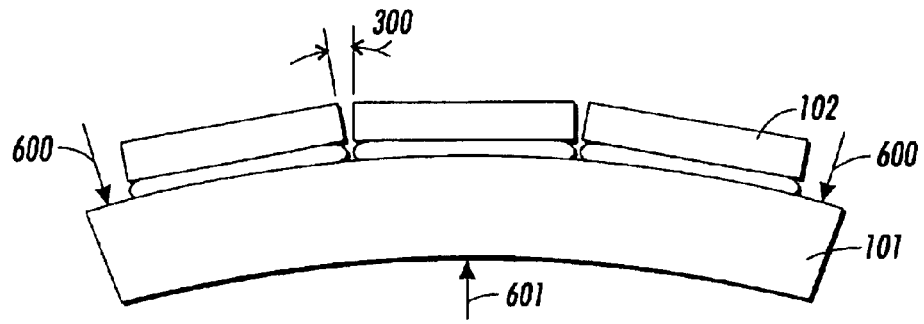
FIG. 6 depicts a schematical side view of a full width image sensor array with an arc induced in the substrate by application of opposition and restraining forces.
Figure 7:
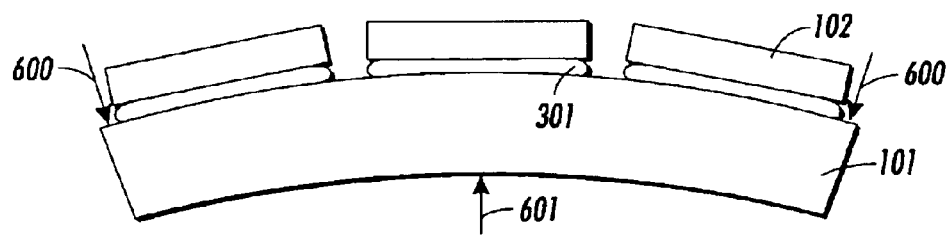
FIG. 7 depicts the schematical side view of a full width image sensor array with an arc of FIG. 6 during adhesive cure.
Figure 8:
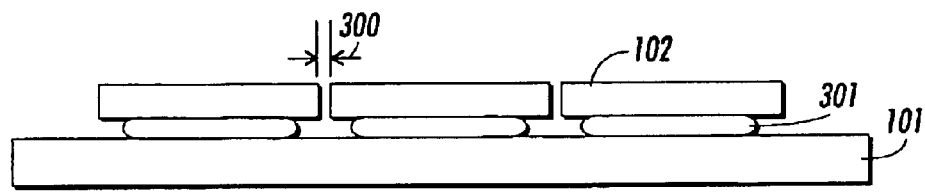
FIG. 8 depicts the FIG. 7 schematical side view of a full width image sensor array with an arc after adhesive cure and upon the return to stasis of the substrate from release of restraining forces.
Figure 12:
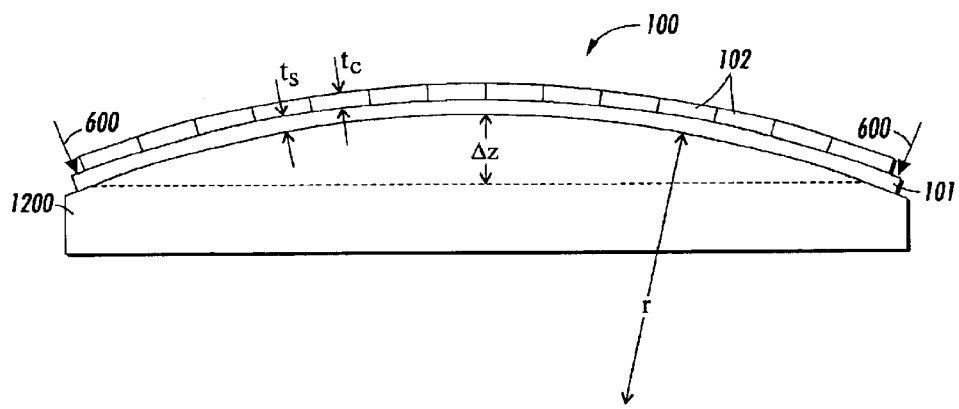
FIG. 12 schematically shows a full width image sensor array and depicts the delta z for specifying the radius of curvature.

FIGS. 6 through 8 show the same adhesive 301 curing stages as depicted in FIGS. 3–5 discussed above but with methods consonant with the teachings of the present invention so applied as to reduce or eliminate the room temperature gap 300 shown in FIG. 5. Very simply, the chips 102 are built on a substrate 101 arced upon convex restraining plate with restraining forces 600 applied. The restraining forces are most typically applied at the substrate endpoints as depicted in FIGS. 6, 7, and 12. In one alternative, embodiment restraining forces 600 are combined instead with opposition force 601 to achieve the convex bend to substrate 101 as depicted in FIG. 6. In one preferred embodiment, the chips 102 are initially butted end-to-end with little or no starting gap between them. As shown in FIG. 7, the substrate 101 may then be kept on the same or a different convex restraining plate while restraining forces 600 are applied during the epoxy 301 cure. FIG. 8 depicts how once the epoxy 301 is done curing, the bar 100 has cooled, and the restraining forces 600 released, the substrate 101 (and thus bar 100) can be used in a flat position with minimized room temperature gaps 300, or even with no gaps. The range of gap achieved by this methodology is variable right down to as little as no gap, or even to no gap combined with some compression amongst the chips. The final resulting gap $d_g$ after cure in curvature is a function of the geometry of the radius of curvature and the arrangement of the chips when first placed.

FIGS. 9, 10, 11 and 12 show the relevant geometry used to calculate the radius of curvature for the restraining plate. If one desires to reduce the gap is but not have the chips butted in the final flattened state, the radius of curvature can be adjusted by changing de in the formula given below to a number that is less than the gap 300 naturally created during curing. Conversely, if one wants to make sure that the chips 101 are always butted, sometimes under slight compression, de can be increased to allow for any natural variations in the curing no induced gap. Since reliability studies have shown that slight compression does not appear to damage the chips over the course of as many as 100 thermal cycles, some constant compression can be tolerated at room temperature. As a practical reality, when the scanner bar 100 is running it will warm up and actuality relieve some or all of the compression. This is actually a benefit where it is desirable to eliminate any chip-to-chip gaping that results from the heating up of the FWA scanner bar 100 during normal use and operation.

Some curvature at stasis may be retained in the FWA bar 100 after release of the restraining forces. However, as a practical matter the amount of residual curvature at stasis is readily flattened out when the FWA bar 100 is subsequently mounted and constrained in an image scanner housing.

Formulas for radius of curvature (r)—See FIGS. 9, 10, 11 & 12. In a first approximation for $d_e$, the resultant gap between chips after cure while still arced, where r is the radius of curvature, l is the chip length (and for one example embodiment is 15,748 microns), and where T is temperature:

$$d_e=[TCE(FR-4)-TCE(\text{Silicon})]\times l\times \Delta T=(13-3)\text{ppm}/^\circ C.\times 15{,}748\ \text{um}\times 100^\circ C.=15.7\ \text{um}$$

Figure 9:
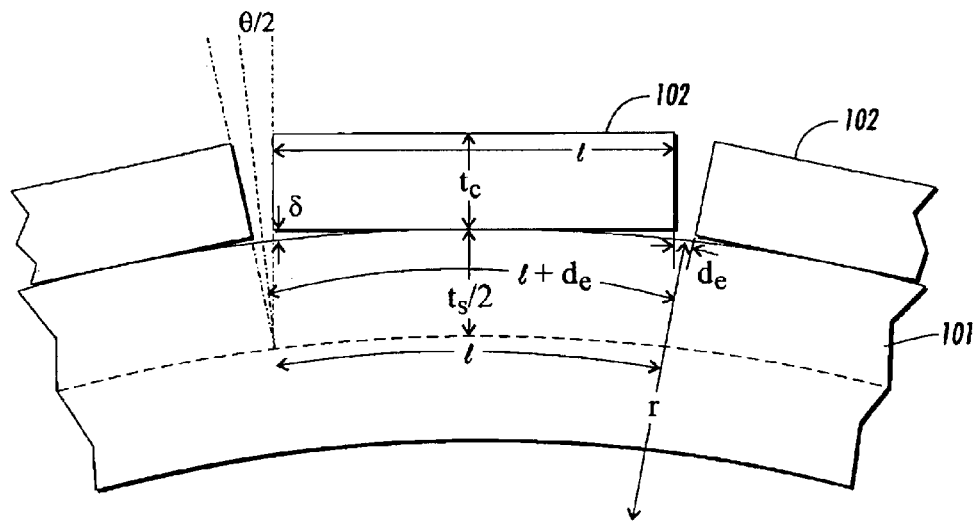
FIG. 9 provides a schematical close up of the chip-to-chip gap and the parameters for determining a radius of curvature.

In actuality, $d_e$ is much lower due to adhesive coverage and cure lock-in temperature. So, $d_e$ must ultimately be empirically determined and verified. However, for establishing an approximate estimation and starting point for a radius of curvature the following approach is useful:

For small angles, the arc of a circle can be replaced by a straight line, and $\delta$ of FIG. 9 is very small. Using the ratio of the similar resulting equilateral triangles with same $\theta$, we get:

$$r/(l+d_e)=(t_s/2+\delta)/d_e\ [\text{or you could use ratio of radii and arcs,}$$
$$(l+d_e)/l=r/(r-t_s/2)]$$

$$r=(t+d_e)/d_e\times(t_s/2+\delta)\approx l/d_e\times(t_s/2),$$

as $\delta$ is very small compared to $t_s$ (thickness of the substrate 101), and $d_e$ is small compared to l. So for example where l=15,748 um & $d_e$=15.7 um & $t_s$=60 mils, the radius of curvature is therefore: r=30.09 inches. Please note that the epoxy thickness is not accounted for in the above equation, but would just add to $t_s/2$.

Figure 10:
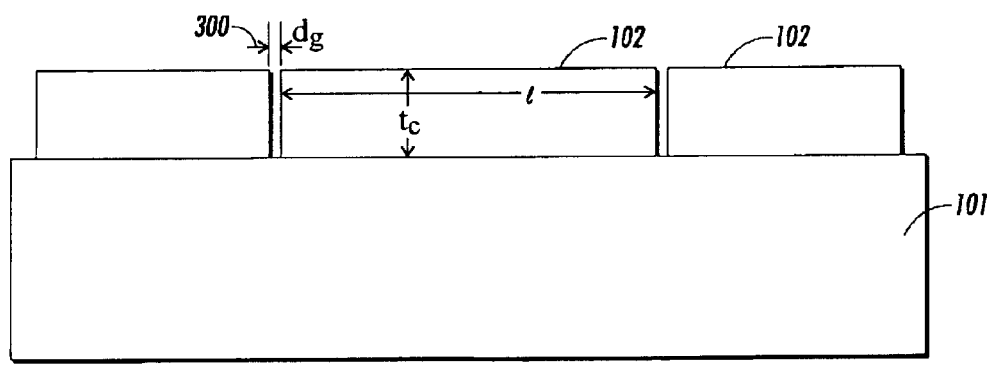
FIG. 10 schematically depicts the improved chip-to-chip gap after release of the radius of curvature.
Figure 11:
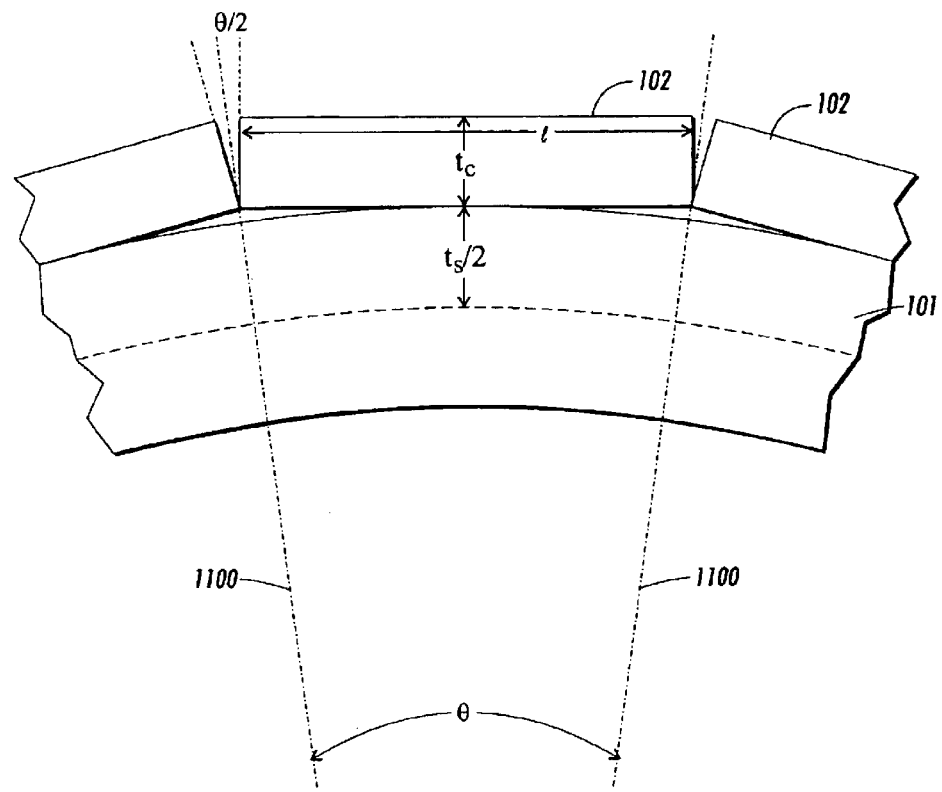
FIG. 11 further depicts the radius of curvature lines relative the substrate and sensor chip.

FIG. 10 shows the resultant $d_g$ after the restraining forces 600 are released, and the substrate 101 has returned to stasis. Gap 300 now being the resultant $d_g$, it is thereby minimized. In FIG. 11 two radius of curvature lines 1100 are depicted to show how r=distance from the top of the substrate 101 back to where the radii meet at the center.

While the radius of curvature is enough to describe the flexure needed, sometimes a model shop may prefer to know the array 100 midpoint flexure amount. This is delineated in FIG. 12 and labeled $\Delta z$, and so:

$$\Delta z(\text{middle-end chip})=r\times(1-\cos(0.5\times360^\circ\times12.4\ \text{in}/2\ \pi r)),\text{ and so for a 12.4 inch sensor array the mid array flexure would be}$$
$$\Delta z(\text{middle-end chip})=0.636\ \text{inches}$$

Note: For a more realistic $d_e$=5 um, r=94.49 in, $\Delta z$(middle)= 0.203 inches $$\theta/2=\tan^{-1}[d_e/2/(t_s/2)],\text{ for reference only}$$

$$\theta\approx d_e/t_s,\text{ in radians, for small angles}$$

FIG. 12 depicts a full width array sensor bar 100 comprising an FR-4 substrate 101 and twenty sensor chips 102. A convex restraining plate 1200 is provided and FWA sensor bar 100 is pinned against it into the appropriate arc by application of restraining forces 600. The appropriate arc is specified as described above by the radius of curvature "r" or with $\Delta z$ and the end-to-end length of the sensor bar 100.

In closing, by an appropriate convex curving of the substrate prior to adhering the chips and allowing the adhesive to cure, when the cure and resultant thermal cycle is complete allowing release of the constraining forces from the substrate, closely abutted chips will be provided despite differing thermal coefficients of expansion between the substrate and chips. Furthermore, application of this methodology will allow the substitution of less expensive substrate materials and allow the benefit of the cost savings that result therefrom.

While the embodiments disclosed herein are preferred, it will be appreciated from this teaching that various alternative, modifications, variations or improvements therein may be made by those skilled in the art. For example, it will be understood by those skilled in the art that the teachings provided herein may be applicable to many types of die, adhesive and substrate. It will be understood that the thermal cycle may be the result of other activities other than the curing of adhesive or that if the thermal cycle is result of curing that the adhesive being used is not necessarily from adhering the chips/dies to the substrate. It will also be understood by those so skilled that such different materials will require varying applied arcs to the substrate in order to be accommodated. All such variants of processing technique are intended to be encompassed by the following claims:

What is claimed is:

1. A method for assembling chips upon a substrate comprising:
    arcing a convex curve in the substrate by applying restraining forces;
    placing the chips upon the curved substrate;
    allowing a thermal cycle subsequent to the placement of the chips; and
    releasing the restraining forces once the thermal cycle is complete to allow the substrate to return to stasis.

2. The method of claim 1 wherein the step of placing the chips further comprises that the chips are placed so as to abut each other.

3. The method of claim 2 wherein the thermal cycle is the result of curing adhesive.

4. The method of claim 3 wherein the curing adhesive is bonding the chips to the substrate.

5. The method of claim 1 wherein the step of placing the chips further comprises that the chips are placed so as to provide an initial gap between the chips.

6. A method for assembling chips upon a substrate comprising:
    arcing a convex curve in the substrate by applying restraining forces;
    placing the chips upon the curved substrate; and
    releasing the restraining forces to allow the substrate to return to stasis.

7. The method of claim 6 wherein the step of placing the chips further comprises that the chips are placed so as to abut each other.

8. The method of claim 6 wherein the step of placing the chips further comprises that the chips are placed so as to provide an initial gap between the chips.

9. The method of claim 6 wherein the step of arcing further comprises applying an opposition force at the midpoint of the face of the substrate and applying restraining forces to the opposite face of the substrate at the endpoints of the substrate.

10. A method for assembling chips upon a substrate comprising:
    placing one face of the substrate against a convex restraining plate;
    applying restraining forces to the opposite face of the substrate to establish an arc in the substrate;
    placing the chips upon the curved substrate;
    allowing a thermal cycle; and
    releasing the restraining forces to allow the substrate to return to stasis.

11. The method of claim 10 wherein the step of placing the chips further comprises that the chips are placed so as to abut each other.

12. The method of claim 10 wherein the thermal cycle is the result of curing adhesive.

13. The method of claim 12 wherein the curing adhesive is bonding the chips to the substrate.

14. A method for assembling chips upon a substrate to make a full width array comprising:
   choosing a radius of curvature;
   applying that radius of curvature to a first face of a convex restraining plate;
   placing one face of the substrate against the first face of the convex restraining plate;
   applying restraining forces to the opposite face of the substrate to establish an arc in the substrate;
   placing the chips with adhesive upon the curved substrate;
   allowing a thermal cycle of the curing adhesive; and
   releasing the restraining forces to allow the substrate to return to stasis.

15. The method of claim 14 wherein the step of placing the chips further comprises that the chips are placed so as to abut each other.

16. The method of claim 15 wherein the radius of curvature is chosen so as to result in smaller gap from chip-to-chip at stasis than if no radius of curvature was applied.

17. The method of claim 15 wherein the radius of curvature is chosen so as to result in butting of the chips at stasis.

18. The method of claim 15 wherein the radius of curvature is chosen so as to result in compression of the chips edge-to-edge at stasis.

19. The method at claim 18 wherein the compression is sufficient that upon subsequent thermal expansion from operation of the full width array there is minimal gap opened between the chips.

20. The method of claim 18 wherein the compression is sufficient that upon subsequent thermal expansion from operation of the full width array there is no gap opened between the chips.

21. A method for assembling chips upon a substrate comprising:
   arcing a first curve in the substrate by applying restraining forces;
   placing the chips upon the curved substrate;
   arcing a second curve in the substrate by applying restraining forces;
   allowing a thermal cycle; and
   releasing the restraining forces to allow the substrate to return to stasis.

22. The method of claim 21 wherein the step of placing the chips further comprises that the chips are placed so as to abut each other.

23. The method of claim 22 wherein the second curve is greater than the first curve.

24. The method of claim 23 wherein the thermal cycle is the result of curing adhesive bonding the chips to the substrate.

* * * * *